United States Patent [19]

Dingwall

[11] 4,001,606
[45] Jan. 4, 1977

[54] ELECTRICAL CIRCUIT

[76] Inventor: Andrew Gordon Francis Dingwall, 208 Riverview Drive, Somerville, N.J. 08876

[22] Filed: June 3, 1975

[21] Appl. No.: 583,285

[30] Foreign Application Priority Data

June 5, 1974 United Kingdom ............ 24900/74

[52] U.S. Cl. .......................... 307/251; 307/247 R; 307/279; 307/DIG. 1
[51] Int. Cl.² ................ H03K 17/60; H03K 17/06; H03K 17/30; H03K 3/286
[58] Field of Search ............... 307/247 R, 251, 304, 307/DIG. 1, 279

[56] References Cited
UNITED STATES PATENTS

| | | |
|---|---|---|
| 3,457,435 | 7/1969 | Burns et al. .................. 307/304 X |
| 3,720,848 | 3/1973 | Schmidt, Jr. .................. 307/251 |
| 3,764,921 | 10/1973 | Huard ........................... 307/251 X |
| 3,801,831 | 4/1974 | Dame .......................... 307/DIG. 1 X |
| 3,866,064 | 2/1975 | Gregory et al. ................ 307/251 |
| 3,916,430 | 10/1975 | Heuner et al. ................ 307/279 X |

*Primary Examiner*—John S. Heyman
*Assistant Examiner*—Larry N. Anagnos

[57] ABSTRACT

Input signals lying outside the power supply range are used to develop potentials which are applied to the gate electrodes and substrates of transistors forming a transmission gate, when the transistors are to be turned off. The transmission gate circuit can then block input signals outside the range of its power supply.

18 Claims, 3 Drawing Figures

ELECTRICAL CIRCUIT

This invention relates to circuits in which input signals which lie outside the range of the operating voltage supply are used to develop bias potentials to control the operation of the circuits.

Figure 1:
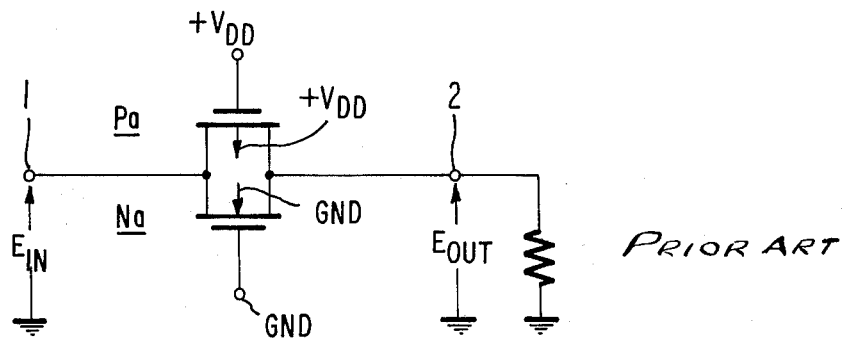
Figure 2:
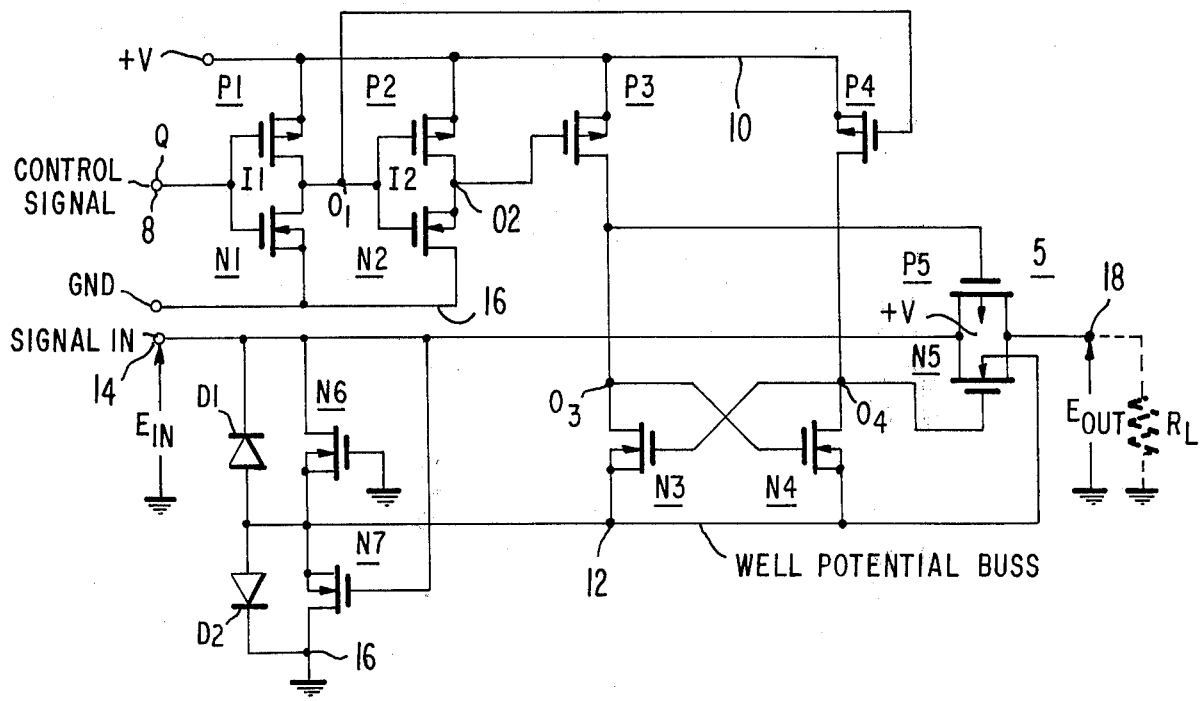
Figure 3:
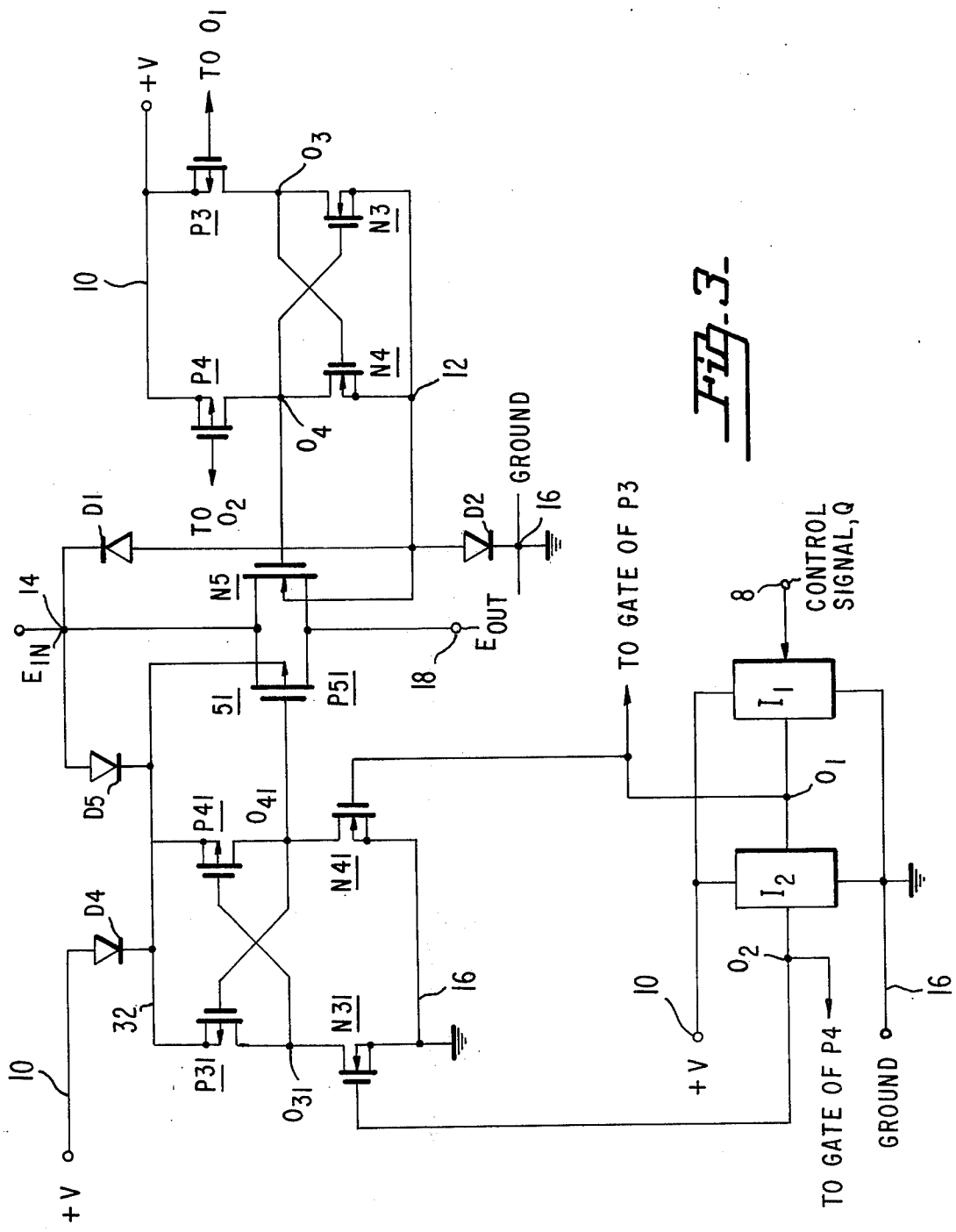

In the drawings appended hereto like reference characters denote like components; and FIG. 1 is a schematic diagram of a prior art transmission gate circuit; and FIGS. 2 and 3 are schematic diagrams of transmission gate circuits embodying the invention.

The circuit of FIG. 1 is used to illustrate a problem which exists when an input signal, $E_{IN}$, applied to a transmission gate is either more negative than, or more positive than, the voltages ($+V_{DD}$ volts and ground) applied to the control electrodes of the transmission gate transistors. FIG. 1 includes a complementary transmission gate comprised of insulated-gate field-effect transistors (IGFETs) Na and Pa, of N and P conductivity type, respectively, having their conduction paths connected in parallel between an input terminal 1 and an output terminal 2. The transmission gate is supposedly cut off (i.e. substantially no signal passes through it) when $+V_{DD}$ volts is applied to the gate electrode and substrate of transistor Pa and zero volts is applied to the gate electrode and substrate of transistor Na. However, if the signal $E_{IN}$ goes more negative than ground, the electrode of transistor Na connected to terminal 1 functions as a source electrode and transistor Na (when its threshold voltage, $V_T$, is exceeded) turns on since the potential at its source electrode is more negative than the potential at its gate electrode. Similarly, if the signal $E_{IN}$ goes more positive than $+V_{DD}$ volts, the electrode of transistor Pa connected to terminal 1 functions as a source electrode, and transistor Pa is turned on (when its $V_T$ is exceeded) since the potential at its source electrode is more positive than that at its gate electrode. Consequently, for signals outside the range of the available operating voltage, the transmission gate cannot be cut off and provides a relatively low impedance path between the input and output terminals. This problem is overcome in circuits embodying the invention.

Circuits embodying the invention respond to values of the input signal lying outside the range of the power supply voltage by developing control potentials whose values be outside the range of the operating voltage. In one embodiment including a transistor operated as a transmission gate, potentials derived from the input signal and applied to the control electrode of the transistor bias the transmission gate transistor off even when the input signal is applied to one end of the conduction path of the transistor. In particular, the derived potential may be approximately equal in value to the potential of said input signal. The potential derived from the input signal is applied to the control electrode of the transmission gate transistor when the latter is to be turned off.

The transistors used to illustrate the invention are insulated-gate field-effect transistors (IGFETs) of the enhancement type formed in bulk silicon, but bipolar transistors, IGFET depletion type transistors, or IGFET transistors formed on an insulator substrate could be used instead. The transistors of P-conductivity type are identified by the letter P and a reference numeral, and are shown in the drawing with an arrow on their substrate connection pointing away from the body of the transistor. The transistors of N conductivity are identified by the letter N and a reference numeral, and are shown in the drawing with an arrow on their substrate connection pointing towards the body of the transistor.

The characteristics of IGFETs are well known and need not be described in detail. But, for a clearer understanding of the description to follow, the following definitions and characteristics pertinent to the invention are set forth:

1. The IGFETs used have a first electrode and a second electrode which define the ends of a conduction path and a control electrode (gate) whose applied potential determines the conductivity of the conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to forward bias the gate with respect to the source and is greater in magnitude than a given value, which is defined as the threshold voltage ($V_T$) of the transistor.

3. IGFETS are bidirectional in the sense that when an enabling signal is applied to the control electrode, current can flow in either direction in the conduction path defined by the first and second electrodes, i.e. the source and drain are interchangeable.

In the circuit of FIG. 2 the operating or supply voltages are $+V$ volts and ground. Transmission gate transistor (N5) when turned off remains cut off even when negative (below ground) input signals are applied to the input 14 of the transmission gate 5. The circuit includes transistors P1 and N1 connected to form a complementary inverter I1 and transistors P2 and N2 connected to form a complementary inverter I2. The gate electrodes of transistors P1 and N1, which define the input of inverter I1, are connected to terminal 8 to which is applied a control signal Q. The drains of transistors P1 and N1 are connected to the output $O_1$ of inverter I1, to the gates (input) of inverter I2, and to the gate of a transistor P4. The drains of transistors P2 and N2 are connected to the output $O_2$ of inverter I2 and to the gate of a transistor P3. The source electrodes and substrates of transistors P1, P2, P3 and P4 are connected to conductor 10 to which is applied $+V$ volts. The source electrodes and substrates of transistors N1 and N2 are connected to conductor 16 to which is applied ground potential. $+V$ volts and ground (zero) represent the most positive and the most negative operating voltage, respectively, applied to the circuit.

Transistors P4 and P3 together with transistors N3 and N4 form a level shift cross-coupled network. Transistors N3 and P3 form an inverter and their drains, which define output $O_3$, are connected to the gates of transistors N4 and P5. Transistors N4 and P4 also form an inverter and their drains, which define output $O_4$, are connected to the gates of transistors N3 and N5. Transistors N3 and N4 are connected at their sources and substrates to conductor 12. When the circuit of FIG. 2 is formed in bulk silicon, transistors N3 and N4 may be formed in the same P-well region and therefore share the same substrate region. Conductor 12 is connected to their P-well, and the substrates of both transistors and conductor 12 are held at the same potential.

Transmission gate 5 includes transistors P5 and N5 having their conduction paths connected in parallel between the signal input point 14 and the signal output point 18. The substrate of transistor P5 is connected to +V volts. The substrate of transistor N5 is connected to conductor 12. In bulk silicon, transistor N5 may be formed in the same P-well region and share the same substrate as transistors N3 and N4.

A diode D1 is connected at its cathode to the input 14 and at its anode to conductor 12. A transistor N6 has its conduction path connected between terminal 14 and conductor 12 and its gate connected to ground potential. A diode D2 is connected at its anode to conductor 12 and at its cathode to ground potential. The conduction path of transistor N7 is connected in parallel with diode D2 and its gate is connected to input 14.

The operation of the circuit may best be explained by noting the following: 1) Diode D1 and transistor N6 function to couple the input signal ($E_{IN}$) from terminal 14 to conductor 12 when $E_{IN}$ is more negative than the potential on conductor 12 ($V_{12}$). When $E_{IN}$ is more negative than $V_{12}$ by an amount which exceeds the forward voltage drop ($V_F$) of diode D1, diode D1 conducts in the forward direction and clamps conductor 12 to a value equal to negative going $E_{IN}$ plus the $V_F$ of diode D1. When $E_{IN}$ goes negative, with respect to ground, by more than the threshold voltage ($V_T$) of transistor N6, the latter turns on and clamps conductor 12 through its low impedance conduction path to terminal 14. Thus, for $E_{IN}$ more negative than ground, $V_{12}$ is approximately equal to $E_{IN}$; and 2) Diode D2 and transistor N7 function to maintain $V_{12}$ at or close to ground potential when $E_{IN}$ is more positive than ground potential. The potential on conductor 12 cannot go more positive than one $V_F$ drop above ground because diode D2 conducts and clamps conductor 12 to $V_F$ volts above gound. In addition, as the input signal goes more positive than ground by the $V_T$ of transistor N7, the latter is turned on and clamps conductor 12 to ground through its low impedance conduction path. Thus, for $E_{IN}$ greater than zero volts, $V_{12}$ is at, or close to, zero volts.

The control signal Q determines the levels at the outputs $O_1$ and $O_2$ of inverters I1 and I2. The outputs of the inverters in turn control the states of the level shift network which, in turn, controls the turn-on and turn-off of transmission gate 5.

When the control signal (Q) is equal to, or close to, zero volts, the outputs $O_1$ and $O_2$ go high (+V volts) and low (zero volts), respectively. $O_1$ — high causes transistor P4 to be turned off. $O_2$ — low causes transistor P3 to be turned on, causing the signal at $O_3$ to go high (+V volts). $O_3$ — high turns-on transistor N4 which turns off transistor N3 and clamps output $O_4$ to conductor 12. Consequently, $O_3$ — high is applied to the gate electrode of transistor P5 and $V_{12}$ is coupled to the gate of transistor N5. For this control signal condition the transmission gate (P5 and N5) is non-conducting for all values of $E_{IN}$ less than +V volts as demonstrated below.

For $E_{IN}$ more positive than zero volts $V_{12}$ is at or close to, zero volts as noted above. Transistor N5 whose gate is clamped to conductor 12 and whose substrate is tied to conductor 12 remains cut off for all values of $E_{IN}$ more positive than ground. Transistor P5 whose gate is clamped to +V volts and whose substrate is tied to +V volts remains cut off for all values of $E_{IN}$ less than +V volts.

When $E_{IN}$ goes negative, below ground, conductor 12 is charged to a potential approximately equal to $E_{IN}$ as noted above. Thus, as $E_{IN}$ applied to the source of transistor N5, goes negative, so does the potential on conductor 12 applied to the gate and substrate of transistor N5. The gate-to-source potential of transistor N5 is thus maintained at approximately zero volts and the transistor remains cut off. Transistor P5 with its gate clamped to +V volts is driven deeper into cut off as $E_{IN}$ applied to its source goes more negative.

Thus, for Q-low, transmission gate 5 remains cut off for all values of input signals more negative than +V volts. It should be mentioned that the discussion assumes that the signals applied are lower in magnitude than the breakdown potentials of the circuits components.

When Q goes high (at or close to +V volts) the output $O_1$ goes low and output $O_2$ goes high. Transistor P3 is turned off. Transistor P4 is turned on causing the output $O_4$ to go high (at or close to +V volts) and transistor N3 to turn on. The turn-on of transistor N3 causes the output $O_3$ to be clamped to conductor 12 and transistor N4 to be turned off. As a result, approximately, +V volts is applied to the gate of transistor N5, turning it on, and V12, which is at most one diode drop above ground or more negative than ground potential, is applied to the gate of transistor P5 turning it on. Any $E_{IN}$ will pass from terminal 14 to terminal 18 through the relatively low impedance, high conduction path provided by transmission gate transistors P5, N5.

The input signal coupled to conductor 12 is applied to the substrate of transistor N5. But since $V_{12}$ is close to the most negative potential in the circuit it tends to reverse bias the PN junctions of transistor N5. Therefore, only minimal leakage current can flow.

In addition, when transistor N3 is on, transistor P3 is off and when transistor N4 is on transistor P4 is off. When transistor N3 is on, $V_{12}$ is coupled through its low on impedance to output $O_3$ and the gates of transistors P5 and N4. When transistor N4 is on $V_{12}$ is coupled through its low on impedance to output $O_4$ and the gates of transistors N3 and N5. The gates of the transistors connected to output points $O_3$, and $O_4$ do not load down these points significantly. Therefore, the level shift circuit and the network coupling the input signal to conductor 12 do not load significantly the input signal since the signal is applied to relatively high impedance points.

Table 1 below summarizes the results obtained with the circuit of FIG. 2 when a 100K ohm resistive load ($R_L$) is connected to output terminal 18. CD4007 packages which are commercially available complementary MOS devices manufactured by the RCA Corporation, were used to breadboard the circuit. A potential of 10 volts was applied to conductor 10 and 0 volts was applied to conductor 16.

| Signal Into Terminal 14 | Output at Terminal 18 With Transmission Gate Enabled (Control High) | Output At Terminal 18 With Transmission Gate Disabled (Control Low) |
|---|---|---|
| −9.995 | −9.995 | 0.000 |
| −1.000 | −1.000 | 0.000 |
| −0.200 | −0.200 | 0.000 |
| 0.000 | 0.000 | 0.000 |
| 9.995 | 9.993 | 0.000 |
| 1.000 | 0.999 | 0.000 |

-continued

| Signal Into Terminal 14 | Output at Terminal 18 With Transmission Gate Enabled (Control High) | Output At Terminal 18 With Transmission Gate Disabled (Control Low) |
| --- | --- | --- |
| 0.200 | 0.200 | 0.004 |
| 0.000 | 0.000 | 0.000 |

Instead of the connections shown in FIG. 2, the gate of transistor P5 could be connected to output $O_4$ and the gate of transistor N5 could be connected to output $O_3$. For such connections a Q-high would render transistors P5 and N5 non-conducting, thereby disabling transmission gate 5, and Q-low would enable the transmission gate.

FIG. 3 shows a transmission gate circuit which can block an input signal which exceeds in either the positive or the negative direction, the maximum operating voltages supplied to the circuit of which the transmission gate is part.

The transmission gate 51 includes transistors N5 and P51 having their source-drain paths connected in parallel between terminals 14 and 18.

The circuitry for controlling the turn-on and turn-off of transistor N5 is similar to that shown in FIG. 2 and need not be greatly detailed. Transistors N6 and N7 have been eliminated since $V_{12}$ can be slightly offset from ground or $E_{IN}$.

The gate of transistor N5 is connected to output $O_4$ and the gates of transistors P3 and P4 are connected to outputs $O_1$ and $O_2$, respectively. As described below, for the connections shown in FIG. 3, transistor N5 is turned on when Q is low and turned off when Q is high. This is the inverse of the condition in FIG. 2, but in no way alters the inventive concept.

The turn-on and turn-off of transistor P51 is controlled by a level shift network comprised of transistors P31, N31, P41 and N41. Transistors P31 and N31 form an inverter and their drains, which define output $O_{31}$, are connected to the gate of transistor P41. The transistors P41 and N41 form an inverter and their drains, which define output $O_{41}$, are connected to the gates of transistors P31 and P51. Transistors P31 and P41 are connected at their sources and substrates to a conductor 32. The substrate of transistor P51 is also connected to conductor 32. The sources and substrates of transistors N31 and N41 are connected to ground terminal. The outputs $O_1$ and $O_2$ of inverters I1 and I2 are connected to the gates of transistors N41 and N31, respectively.

A diode D4 is connected at its anode to conductor 10 and at its cathode to conductor 32. A diode D5 is connected at its anode to terminal 14 and at its cathode to conductor 32.

In FIG. 3 the gate of transistor N5 is connected to output $O_4$ but could instead have been connected to ouput $O_3$. Similarly the gate of transistor P51 is connected to output $O_{41}$ but could instead have been connected to output $O_{31}$.

Transistor P51 may be formed in, and share, the same substrate region as transistors P31 and P41.

To better explain the operation of the circuit to follow, it should be noted that: 1) for $E_{IN}$ equal to or less than +V volts, the potential on line 32 ($V_{32}$) is at or close to +V volts. Diode D4 couples the +V volts on conductor 10 to conductor 32 causing the minimum potential on line 32 to be at +V volts minus the forward voltage drop ($V_F$) of diode D4 2) For $E_{IN}$ more positive than +V volts the potential on line 32 is at or close to the value of EIN. Diode D5 couples $E_{IN}$ to conductor 32 causing the potential on line 32 to be at $E_{IN}$ minus the $V_F$ of diode D5. It is assumed that the $V_F$'s of all the diodes are the same. 3) As in the circuit of FIG. 2, the potential on conductor 12 is at, or close to, ground potential for $E_{IN}$ more positive than ground and is at, or close to, $E_{IN}$ for $E_{IN}$ more negative than ground, because of diodes D2 and D1, respectively.

For the circuit connections of FIG. 3, the transmission gate 51 is enabled (P51 and N5 are turned-on) when the control signal Q goes low (close to, or equal to, zero volts) and is disabled (P51 and N5 are turned-off) when Q goes high (close to, or equal to, +V volts).

When Q applied to the input of inverter I1 is high (+V volts), the signal at $O_1$ is low (0 volts) and the signal at $O_2$ is high (+V volts). $O_1$ low applied to the gate of transistor N41 turns it off. Transistor N31 turned on due to $O_2$ high, clamps node $O_{31}$ to ground. This turns on transistor P41 which clamps output $O_{41}$ to conductor 32 and turns off transistor P31.

The potential on conductor 32 is then applied via the low impedance conduction path of transistor P41 to the gate of transistor P51. The substrate of P51 is tied to line 32 and is, therefore, always at, or close to, the highest potential present in the circuit. For $E_{IN}$ equal to or greater than +V volts, the potential applied to the source of transistor P51 is $E_{IN}$ and the potential applied to its gate is, at the least, equal to $E_{IN}$ minus $V_F$. Assuming the $V_F$ of the diode is less than the threshold voltage $V_T$ of transistor P51, the transistor remains cut off for all values of $E_{IN}$ equal to or greater than +V volts. The potential at the gate, source and substrate of transistor P51 is held approximately equal. The potential at all three points rise together in response to rising signals. Therefore, transistor P51 remains cut off for all values of signals exceeding +V volts.

For values of $E_{IN}$ more negative than +V volts, transistor P51 is driven more deeply into cut off, since its gate is at or close to +V volts while $E_{IN}$ is applied to its source.

$O_1$ low applied to transistor P3 turns it on. This causes the output $O_3$ to be charged to +V volts which causes transistor N4 to turn on. This clamps output $O_4$ to conductor 12 and causes transistor N3 to turn-off. Transistor P4 is turned off by $O_2$ high. As explained for the circuit of FIG. 2, transistor N5, when cut off, remains cut off for all values of $E_{IN}$. For $E_{IN}$ more negative than ground, the source electrode connected to input 14 of transistor N5 is at $E_{IN}$ and its gate potential is at $E_{IN}$ plus $V_F$; where $V_F$ is the forward drop of diode D1. Since $V_F$ of the diode is less than the $V_T$ of transistors N5, the $V_{GS}$ of transistor N5 is less than $V_T$ and it remains cut off for all values of $E_{IN}$ more negative than ground. For $E_{IN}$ more positive than ground, the potential applied to the gate of transistor N5 is at or close to ground potential and transistor N5 is driven deeper into cut off.

Therefore, transmission gate 51, when disabled blocks signals which exceed the available operating voltages i.e. more positive than +V or more negative than ground.

When Q goes low, the output $O_1$ goes high and the output $O_2$ goes low. Transistor P3 is turned off and transistor P4 is turned on. The output $O_4$ is clamped to +V volts, causing the turn-on of transistor N4. $O_1$ high and $O_2$ low also cause transistor N31 to be turned off and transistor N41 to be turned on. The output O₄₁ is clamped to ground causing the turn on of transistors P31 and P51. The turn on of transistor P31 turns off transistor P41. The turn on of transistors P51 and N5 cause transmission gate 51 to be enabled and provides a low impedance path for signals between terminals 14 and 18.

Although the circuits shown in the Figures use transistors of complementary conductivity type, it should be understood that circuits embodying the invention may be constructed using transistors of one conductivity (P or N).

It should also be appreciated that where circuits embodying the invention are manufactured on an insulator substrate, such as sapphire, no connection need be made to the substrates of the transmission gate transistors or to any of the other transistors of the circuit.

It has been shown that the available power supply voltages (+V volts and ground) are applied to the input inverters (I, I₂) and that input signals exceeding the power supply voltages are used to generate potentials (V₁₂, V₃₂) outside the range of the power supply potentials. Level shift circuits controlled by the input inverters are operated from the potentials generated from the input signals. The level shift circuits are used to control one or more transmission gate transistors. It should be appreciated that the controlled transistors could be, instead, part of a logic circuit or other circuit type. It should also be appreciated that the level shift circuit enables the switching of potential levels outside the range of the power supply voltages and the control of circuits to which are applied input signals outside the range of the power supply potentials.

What is claimed is:

1. An electrical circuit including:
   a signal input point and a signal output point;
   a transistor having first and second electrodes defining the ends of a conduction path and a control electrode; said first electrode being connected to said signal input point, and said second electrode being connected to said signal output point; said transistor being turned on in response to a signal applied between its control electrode and said first electrode of given relative polarity and greater than a given amplitude; and
   means for selectively turning off said transistor including means connected between said signal input point and said control electrode and responsive to values of the input signal of a sense and amplitude tending to turn the transistor on for applying a signal of the same sense to the control electrode of said transistor and of an amplitude such as to overcome said tendency whereby said transistor is maintained in a non-conducting condition.

2. In the circuit as claimed in claim 1 further including a first point adapted to receive a first fixed voltage having a polarity and magnitude to turn on said transistor when applied to its control electrode;
   means for selectively turning on said transistor including a first switching means connected between the control electrode of said transistor and said first point; and
   wherein said means for selectively turning off said transistor including the input signal responsive means includes;
   a. a second point adapted to receive a second fixed voltage of a polarity and magnitude which when applied to said control electrode turns off said transistor when the value of the input signals is between said first and second fixed voltages;
   b. a conductor;
   c. means coupled between said second point and said conductor for applying to said conductor a voltage corresponding to that at said second point when the input signal potential is between said first and second voltages;
   d. means coupled between said input point and said conductor for coupling to said conductor a voltage corresponding to said input signal when the input signal potential is outside the range defined by said first and second voltages and of a sense to tend to turn on said transistor; and
   e. selectively enabled second switching means connected between said control electrode and said conductor.

3. In the circuit as claimed in claim 2 wherein said means coupled between said second point and said conductor includes a first unidirectional conducting means; and
   wherein said means coupled between said input point and said conductor includes a second unidirectional conducting means.

4. In the circuit as claimed in claim 3 wherein said transistor is a first transistor of one conductivity type, and further including a second transistor of second, different, conductivity type having its conduction path connected in parallel with that of said first transistor.

5. In the circuit as claimed in claim 4, wherein said transistors of one and second conductivity type are insulated-gate field-effect transistors.

6. In the circuit as claimed in claim 5, further including third and fourth switching means, said third switching means being connected between the control electrode of said second transistor and said first point and said fourth switching means being connected between the control electrode of said second transistor and said conductor.

7. In the circuit as claimed in claim 5, further including: a) a second conductor; b) means for coupling the potential at said first point to said second conductor when the input signal potential is between said first and second voltages; c) means connected between said input point and said second conductor for applying a potential at said second conductor corresponding to that of said input signal when the input signal potential is outside the range defined by said first and second voltages and is of a polarity and amplitude to turn on said second transistor; d) a third switching means connected between the control electrode of said second transistor and said second conductor; and e) a fourth switching means connected between the control electrode of said second transistor and said second point.

8. In the circuit as claimed in claim 2 wherein said first fixed voltage is more positive than said second fixed voltage.

9. In the circuit as claimed in claim 2 wherein said first fixed voltage is more negative than said second fixed voltage.

10. In the circuit as claimed in claim 1, further including; first and second terminals for the application therebetween of an operating potential and where the potential at said first terminal is more positive than that at said second terminal;
   a first switching means connected between the control electrode of said transistor and said first terminal;

wherein said means for selectively turning off said transistor includes:
a. a conductor;
b. a first unidirectional means connected between said second terminal and said conductor;
c. a second unidirectional means connected between said signal input point and said conductor for coupling the input signal to said conductor when the input signal is more negative than the potential at said second terminal; and
d. wherein said means for turning off said transistor includes a second switching means connected between the control electrode of said transistor and said conductor.

11. The combination as claimed in claim 10 wherein said transistor is an insulated-gate field-effect transistor having a substrate; and wherein said substrate is connected to said conductor.

12. In the circuit as claimed in claim 1, further including first and second terminals for the application therebetween of an operating potential and where the potential at said first terminal is more positive than that at said second terminal;
a first switching means connected between the control electrode of said transistor and said second terminal; and
wherein said means for selectively turning off said transistor includes:
a. a conductor;
b. a first unidirectional means connected between said first terminal and said conductor;
c. a second unidirectional means connected between said signal input point and said conductor for coupling the input signal to said conductor when the input signal is more positive than the potential at said first terminal; and
d. wherein said means for turning off said transistor includes a second switching means connected between the control electrode of said transistor and said conductor.

13. The combination as claimed in claim 12 wherein said transistor is an insulated-gate field-effect transistor having a substrate; and wherein said substrate is connected to said conductor.

14. A circuit including:
first and second terminals for the application thereto on a first and second fixed operating voltages, respectively;
an input terminal adapted to receive input signals;
a third terminal;
first means connected between said first and third terminals, and second means connected between said input and third terminals, said first and second means for coupling to said third terminal that one of the input signal potential and second fixed voltage generating the largest potential difference between said second and third terminals; and
means connected between said second and third terminals, said means having at least one output for producing thereat signals varying in potential between the levels at said second and third terminals.

15. In the circuit as claimed in claim 14, wherein said first fixed operating voltage is more negative than said second fixed operating voltage;
wherein the potential at said third terminal is approximately equal to the more negative of the input signal or the first fixed voltage;
further including:
an input circuit having at least one input and at least one output and being connected between said first and second terminals;
means for applying a signal to said at least one input of said input circuit for producing at its at least one output signals which vary between the voltages at said first and second terminals;
wherein each one of said first and second means is a unidirectional conducting means; and
wherein said means connected between said second and third terminals is a level shift circuit having at least one input connected to said at least one output of said input circuit.

16. In the circuit as claimed in claim 14, wherein said first fixed operating voltage is more positive than said second fixed operating voltage;
wherein the potential at said third terminal is approximately equal to the more positive of the input signal or the first fixed operating voltage;
further including:
an input circuit having at least one input and at least one output and being connected between said first and second terminals,
means for applying a signal to said at least one input of said input circuit for producing at its at least one output signals which vary between the voltages at said first and second terminals;
wherein each one of said first and second means is a unidirectional conducting means; and
wherein said means connected between said second and third terminals is a level shift circuit having at least one input connected to said at least one output of said input circuit.

17. The combination as claimed in claim 14, wherein said means connected between said second and third terminals is a level shift circuit which includes two cross-coupled inverters, each inverter including a switching device connected in series with a load device, the switching and load device of one inverter being connected to said at least one output of said level shift circuit, the other end of the conduction path of said switching device being connected to one of said second and third terminals and the other end of the conduction path of said load device being connected to the other one of said second and third terminals; wherein the control electrode of the switching device is connected to said at least one output of said input circuit; and
further including a semiconductor device having a control electrode and a conduction path;
means connecting said control electrode of said semiconductor device to said at least one output of said level shift circuit; and
means connecting one end of said conduction path of said semiconductor device to said input terminal.

18. The combination as claimed in claim 17 wherein said semiconductor device is a transmission gate comprising at least one transistor having a control electrode and a conduction path;
wherein said control electrode of said transmission gate transistor is said control electrode connected to said at least one output of said level shift circuit; and
means connecting the other end of the conduction path of said transmission gate transistor to an output terminal.

* * * * *

UNITED STATES PATENT OFFICE
CERTIFICATE OF CORRECTION

PATENT NO. : 4,001,606
DATED : January 4, 1977
INVENTOR(S) : Andrew Gordon Francis Dingwall It is certified that error appears in the above-identified patent and that said Letters Patent are hereby corrected as shown below:

Title should be --- ELECTRICAL CIRCUIT RESPONSIVE TO INPUT SIGNALS OUTSIDE RANGE OF POWER SUPPLY ---

Col. 6, line 1 --- after "D4" insert --- . ---(period)

Col. 6, line 3 "EIN" should be --- $E_{IN}$ ---

Signed and Sealed this ninth Day of August 1977

[SEAL]

Attest:

RUTH C. MASON
*Attesting Officer*

C. MARSHALL DANN
*Commissioner of Patents and Trademarks*